United States Patent
Yang et al.

(10) Patent No.: US 8,997,592 B2
(45) Date of Patent: Apr. 7, 2015

(54) ASSEMBLY AND METHOD FOR IC UNIT ENGAGEMENT

(75) Inventors: Hae Choon Yang, Singapore (SG); Jong Jae Jung, Singapore (SG); Deok Chun Jang, Singapore (SG); Chong Chen Gary Lim, Singapore (SG)

(73) Assignee: Rokko Systems Pte Ltd, Singapore (SG)

( * ) Notice: Subject to any disclaimer, the term of this patent is extended or adjusted under 35 U.S.C. 154(b) by 319 days.

(21) Appl. No.: 13/518,973

(22) PCT Filed: Dec. 23, 2010

(86) PCT No.: PCT/SG2010/000484
§ 371 (c)(1),
(2), (4) Date: Jun. 25, 2012

(87) PCT Pub. No.: WO2011/078802
PCT Pub. Date: Jun. 30, 2011

(65) Prior Publication Data
US 2012/0260752 A1    Oct. 18, 2012

(30) Foreign Application Priority Data
Dec. 23, 2009  (SG) .................. 200908618-2

(51) Int. Cl.
*H01L 21/677*  (2006.01)
*B65H 29/00*  (2006.01)
*H05K 13/04*  (2006.01)

(52) U.S. Cl.
CPC .................. *H05K 13/0408* (2013.01)

(58) Field of Classification Search
CPC .......... H05K 13/0408; B65H 2404/00; B65H 2406/00
USPC .............. 74/55, 665; 414/266, 277, 797, 627
See application file for complete search history.

(56) References Cited

U.S. PATENT DOCUMENTS

| 4,666,358 A | * | 5/1987 | Wojciechowski ........ 414/223.01 |
| 5,603,599 A | * | 2/1997 | Wesslen et al. ................ 414/411 |
| 6,152,755 A | | 11/2000 | Lee |
| 6,175,466 B1 | | 1/2001 | Hori et al. |

(Continued)

FOREIGN PATENT DOCUMENTS

WO    2006/022597 A2    3/2006

OTHER PUBLICATIONS

International Search Report (PCT/ISA/210) and Written Opinion (PCT/ISA/237) for corresponding PCT International Application No. PCT/SG2010/000484 completed on Mar. 3, 2011 and mailed on Mar. 9, 2011.

(Continued)

*Primary Examiner* — David M Fenstermacher
(74) *Attorney, Agent, or Firm* — Heslin Rothenberg Farley & Mesiti P.C.; Victor A. Cardona

(57) ABSTRACT

A picker assembly includes a plurality of pickers in selective variable spaced relation, a shaft having a plurality of cam plates, the cam plates co-axial with said shaft and having a variable thickness. The cam plates are in engagement with the pickers and positioned in interstitial spaces between the pickers. The selective variability in spacing is provided by rotation of the shaft such that thickness variation of the cam plates move the respective pickers along an axis parallel to the shaft.

19 Claims, 9 Drawing Sheets

(56) References Cited

U.S. PATENT DOCUMENTS

| | | | |
|---|---|---|---|
| 6,262,862 B1 * | 7/2001 | Kato et al. | 360/92.1 |
| 7,464,807 B2 * | 12/2008 | Ham et al. | 198/468.3 |
| 7,939,374 B2 | 5/2011 | Yang | |
| 8,240,726 B2 * | 8/2012 | Subotincic | 294/65 |
| 8,413,790 B2 * | 4/2013 | Nilsson | 198/430 |
| 8,632,294 B2 * | 1/2014 | Subotincic | 414/737 |
| 2005/0081225 A1 | 4/2005 | Tanimoto et al. | |

OTHER PUBLICATIONS

Notification Concerning Transmittal of International Preliminary Report on Patentability (PCT/IB/326) and International Preliminary Report on Patentability (PCT/IB/373) for corresponding PCT Application No. PCT/SG2010/0000484 issued Jun. 26, 2012 and mailed Jul. 5, 2012.

\* cited by examiner

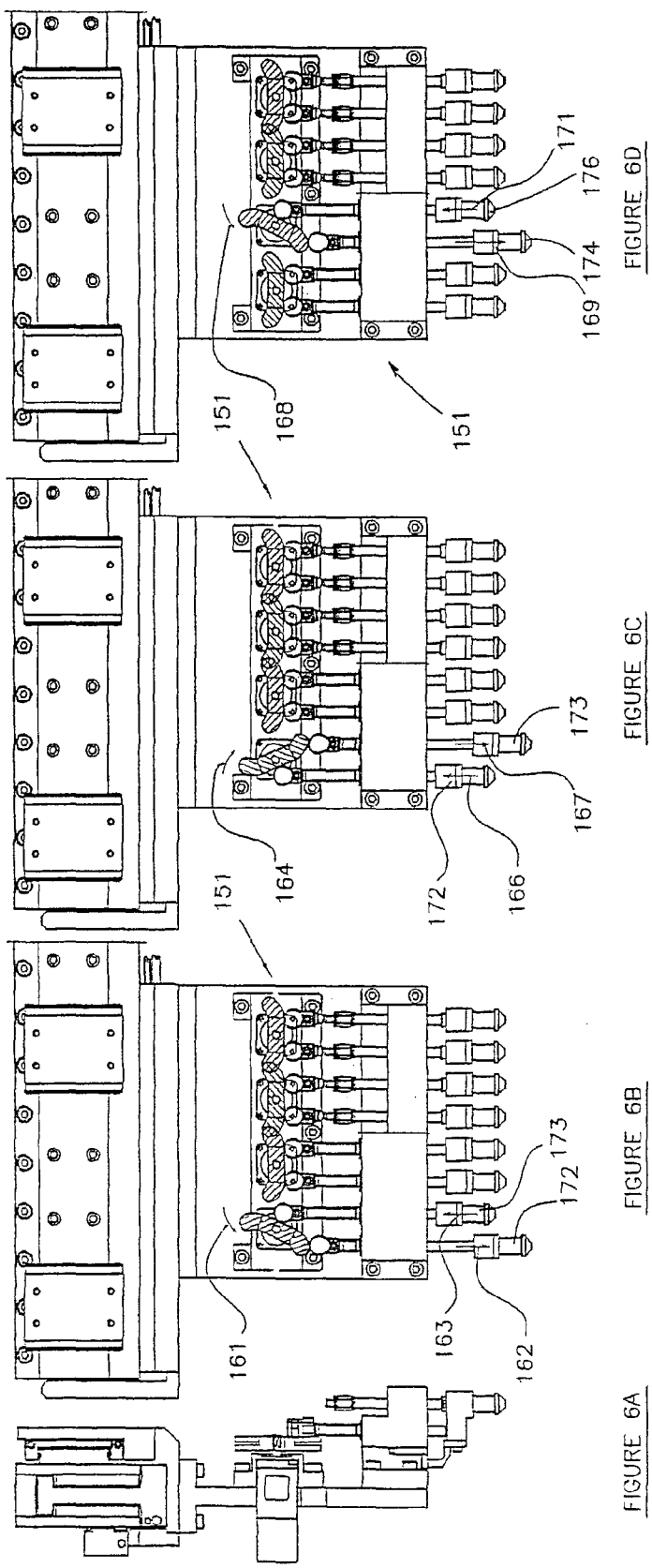

ASSEMBLY AND METHOD FOR IC UNIT ENGAGEMENT

CROSS REFERENCE TO RELATED APPLICATIONS

This application is a national stage of PCT International Application No. PCT/SG2010/000484, filed on Dec. 23, 2010, and published in English on Jun. 30, 2011, as WO 2011/078802 A1, which claims priority from Singapore patent application No. SG 200908618-2, filed on Dec. 23, 2009, the entire disclosures of which are incorporated herein by reference.—

FIELD OF THE INVENTION

The invention relates to the singulation of integrated circuit units and in particular to the assemblies used to engage and transport the individual units. Further still the invention relates to the adaptability of said picker assemblies to adjust the spacing of individual pickers within the assembly.

BACKGROUND

In designing machinery for the processing of substrates and individual IC units, key factors such as minimizing waste, maintaining units per hour (UPH) and limiting downtime for retooling are all key design determinants.

Considering adaptability of said machines, in order for a machine to be useful for a range of applications, it will be necessary for it to accommodate substrates having different spacing between the IC units. Whilst the machine can be retooled for each application, it would be more efficient if the machine can be adapted relatively simply to accommodate said spacing. In particular the picker assemblies used to transport the singulated IC units between stations are dependent upon the spacing of the units in order to engage the units collectively. It would therefore be useful if the spacing of the pickers within the picker assembly could be adjusted to accommodate substrates having different IC unit spacing.

Some systems have been trialled to achieve this function. For instance, one system uses a threaded rod to connect each of the pickers within an assembly. In this case, the thread is at discreet location to coincide with the position of each picker. Further, the thread for each pair of pickers symmetrically placed around a centre line varying based on position, such that rotation of the threaded rod will move the outer pickers further than the inner pickers. Accordingly, the pitch of each portion of the thread will vary based upon the distance from the centre line, and further, with the thread on one side being a forward thread and a reverse thread on the corresponding other side of the centre line.

Whilst this is a simple and direct solution, the manufacture of such a rod may be extremely time consuming and therefore extremely expensive. Any detritus, such as grit, on one of the thread portions may cause damage to the thread, which may require the entire rod to be replaced. Given the environment in which the picker assembly operates, material from a sawing process may be caught in the mechanism. Consequently, the lifetime cost of such a picker assembly based upon replacement of the threaded rod may be considerable.

It would be beneficial if the system for varying the spacing of pickers were both simple in operation and relatively inexpensive also.

In another consideration, with decreasing profit margins for integrated circuits, and in particular, memory, the pressure to reduce processing costs is significant and hence the need to speed production whilst maintaining quality. It follows that the cost of infrastructure to achieve these processes will equally suffer from pressure to reduce cost whilst maintaining speed and quality.

Given the volume of integrated circuit chips contained within a substrate, a potential bottleneck is the ability for the various systems to move the IC units from station to station once singulated. Different systems have been developed to achieve this, for instance that disclosed in PCT/SG2005/000288, the contents of which are incorporated herein by reference. In order for the unit pickers to engage individual IC units, the unit picker assembly involves a complex arrangement designed to engage the various units in a specified manner. Whilst both efficient and effective, the cost and maintenance of such equipment may be particularly high.

Further, such systems are known to create a degree of friction, as well as the potential for backlash.

It would therefore be advantageous to adopt a unit picker assembly that incorporates aspects that may lead to a lower capital cost.

SUMMARY OF INVENTION (00121 In a first aspect the invention provides a picker assembly comprising: a plurality of pickers in selective variable spaced relation; a shaft having a plurality of cam plates, said cam plates co-axial with said shaft and having a variable thickness; said cam plates in engagement with said pickers and positioned in interstitial spaces between said pickers; wherein the selective variability in spacing is provided by rotation of the shaft such that thickness variation of the cam plates move the respective pickers along an axis parallel to the shaft.

In a second aspect the invention provides a method for picker assembly for selectively varying the spacing of pickers within a picker assembly, the method comprising the steps of: rotating a shaft having a plurality of co-axial cam plates, said cam having a variable thickness, said cam plates in engagement with said pickers; biasing said pickers using said cam plates, and consequently; wherein the selective variability in spacing is provided by rotation of the shaft moving the respective pickers along an axis parallel to the shaft so as to vary the respective picker spacing.

The use of cam plates is considerably less expensive than that of fabricating a threaded rod, particularly as in one embodiment the cam plates may be identical and therefore have the benefit of volume manufacture.

Further the shaft and cam plates may be fabricated as a single piece or alternatively the cam plates may be welded or fixed onto the shaft and therefore be relatively easy to manufacture.

An advantage of having the cam plates as separate items to be fixed to the shaft may also allow removable of a damaged cam plate and replaced by another without having to replace the entire shaft and undamaged cam plates.

In one embodiment, the engagement between the pickers and the cam plate may be a resilient engagement such that on reducing the interstitial space, the pickers are biased in order to maintain contact with the cam plates. In a further embodiment the engagement between the cam plates and pickers may be a fixed contact such as a common shaft through the pickers and cam plates with the cam plates having a circumferential slot so as to permit rotation whilst maintaining fixed engagement with the pickers.

In a third aspect the invention provides a picker assembly comprising: a plurality of pairs of pickers, with each picker positioned symmetrically about a centerline, said pairs placed sequentially from an innermost pair closest to the centerline to an outermost pair, furthest from the centerline; a plurality of belts, each belt having a pair of said pickers mounted thereto; each of said belts arranged in a loop about a pair of pulleys, with one picker on an upper part of the loop and corresponding other picker on a bottom portion, such that movement of the belt diverges or converges corresponding pickers within each pair; each belt in communication with a fixed ratio gearbox, with said gearboxes mounted on a common shaft; wherein the gear ration of each gearbox is a function of the position of the corresponding pair of pickers, said ration corresponding to the number of interstitial spaces between corresponding pickers within each pair.

In a fourth aspect the invention provides a method for picker assembly for selectively varying the spacing of pickers within a picker assembly, the method comprising the steps of: providing a plurality of pairs of pickers, with each picker positioned symmetrically about a centerline, said pairs placed sequentially from an innermost pair closest to the centerline to an outermost pair, furthest from the centerline; simultaneously moving a plurality of belts, each belt having a pair of said pickers mounted thereto; diverging or converging corresponding pickers within each pair as a result of moving said belts, and consequently; selectively varying the spacing of said pickers.

In this aspect of the invention, the individual components may be proprietary components or relatively simple to fabricate and assemble. The gear arrangements to drive the timing belts may also be proprietary items. The gear arrangements may also be relatively easy to repair or replace without affecting the overall system.

In a fifth aspect the invention provides a picker assembly for engaging singulated IC units, the assembly comprising: a plurality of unit picker pairs, each unit picker within said pair having an engagement end for engagement of an IC unit; each of said unit pickers movably mounted to permit movement from a retracted position to a unit engagement position; a plurality of curvilinear drive members having arcuate portions at opposed ends, each drive member corresponding to each of said unit picker pairs; each of said unit picker within said corresponding pair arranged to contact the drive member at the arcuate portion of said drive member; wherein each of said drive members being rotatable about a horizontal axis intermediate said opposed ends such that rotation of the drive member in a first direction forces one of said unit pickers downward and a rotation in a second direction drives the other unit picker upwards.

Thus, compared with a rack and pinion assembly, there may be less friction and relatively easy maintenance. Further, the use of the arcuate portions, the rate of deceleration prior to contact, and acceleration on engage the units may be controlled to a greater degree. To this end, there may be less potential for damage to the unit, fatigue loading on the assembly and reduced chance of the shock of acceleration shifting or dislodging the engaged IC unit.

In a further embodiment, each adjacent picker may be separated by a cam. The cams may be mounted to a shaft which is rotated by a pulley arrangement. The picker assemblies may be further mounted to rails through linear bearings which may facilitate sliding movement of the pickers on receiving a separating force of the cams when subjected to a rotation of the shaft to which they are mounted. In this case, the picker assemblies, through the operation of the cams, permit the selection of the picker pitch, which may be from a minimum of 5 mm or less though the embodiment may be varied to provide any useful range of picker pitches.

The pickers may be operated by individual servo-motors in order to activate the reciprocal motion of the picker to engage and disengage the individual IC units.

In a further embodiment, the individual cams may be distributed between two shafts placed one above the other. The individual cams in the top shaft may be placed in alternating interstitial spaces between the pickers, with the cams on the bottom shaft placed in the alternative interstitial spaces.

The shafts may have mounted to them corresponding pulleys which may be belt driven by a motor. Thus, the twin shaft arrangement may achieve the same result as that of the previously described embodiment. It may also have an added advantage of permitting extra clearance due to the alternating arrangement of the cams. That is, by having each adjacent cam offset from each other, the cumulative thickness of all the cams is avoided.

This may allow the use of 10 pickers, or more, and may also allow for a smaller minimum pitch range of, say, 5 mm to 10 mm. This embodiment may be suited for applications where much finer precision, or smaller clearance between IC units within a substrate, is required.

In a further embodiment, a ball screw motor may be used for reciprocating motion of the pickers. It will be appreciated that a ball screw motor may be useful for high precision embodiments, given the increased precision provided by a ball screw motor.

In a further embodiment, pneumatic or hydraulic pistons may be used to operate the reciprocal movement of the pickers, and so simplify the arrangement for each picker. In providing a pneumatic or hydraulic piston, the picker may have a simple piston arrangement, and inlet for receiving the air or hydraulic fluid required. This arrangement may be less bulky than an arrangement using a servo-motor or a ball screw motor. The cost of such an arrangement may also be less and the individual cam design may provide further advantage as it is being machined individually to higher accuracy, such as to ±0.002 mm tolerance, as compared to a more common machining tolerance of ±0.01 mm.

The accumulated pitch error may be eliminated when each individual cam tolerance may be adjusted or controlled to compensate for the accumulated cams tolerance difference of ±0.002 mm.

This method may result in considerable accuracy on IC unit placement onto processing trays, tube after final vision inspection. Individual cams may also be machined from a more durable material like tungsten carbide, ceramic or sapphire more economically as the risk is reduced to single piece of material.

Individual cam design may also have a cost advantage in terms of replacement cost compared with rotary cam rod design which is bulky and expensive to machine (time consuming) from a solid rod steel material to form the contour of each cams onto the rod which represents a not insubstantial technical risk to manufacture.

The use of a cam driven adjustment may permit the handling of below 1×1 mm of package size due to the greater precision of picker pitch adjustment. Further, the individual cam driven adjustment may minimise or eliminate accumulative tolerances, particularly for staggered positioning of the cams along a dual shaft arrangement.

Further, compared with a belt drive adjustment, the use of cams may permit tolerance equivalent to the machining tolerance of the cam, as compared to potential slippage and/or creep effects resulting by belt driven adjustment.

As a note, embodiments of the present invention may be incorporated into a system to be launched by the Applicant in 2011 under the name Rubicon™ Picker Systems.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

FIGS. 6A, 6B, 6C and 6D are sequential elevation views of the picker assembly of FIG. 4A performing a individual engagement.

DETAILED DESCRIPTION

Figure 1A:
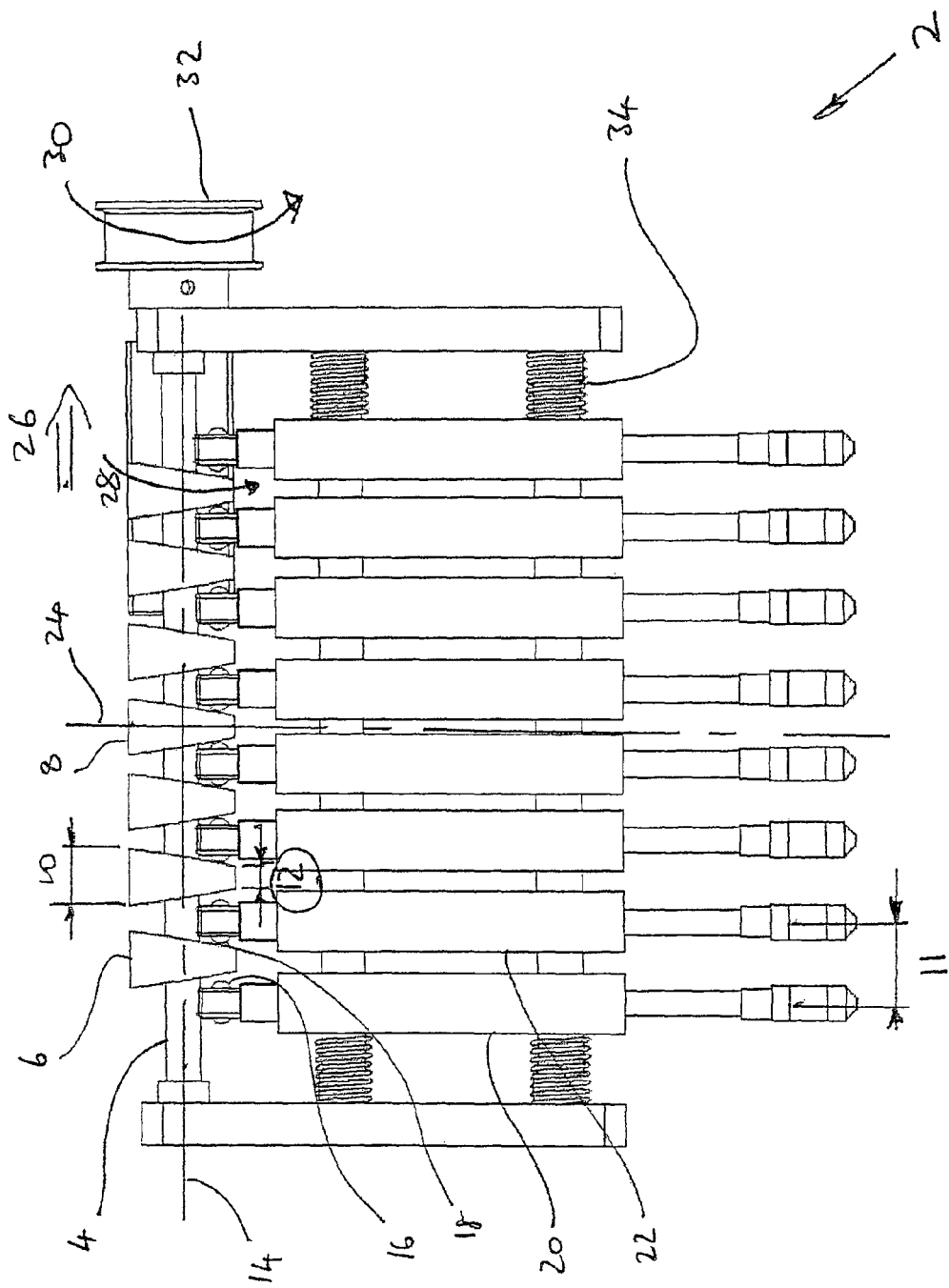
FIGS. 1A and 1B are elevation views of a picker assembly according to one embodiment of the present invention.
Figure 1B:
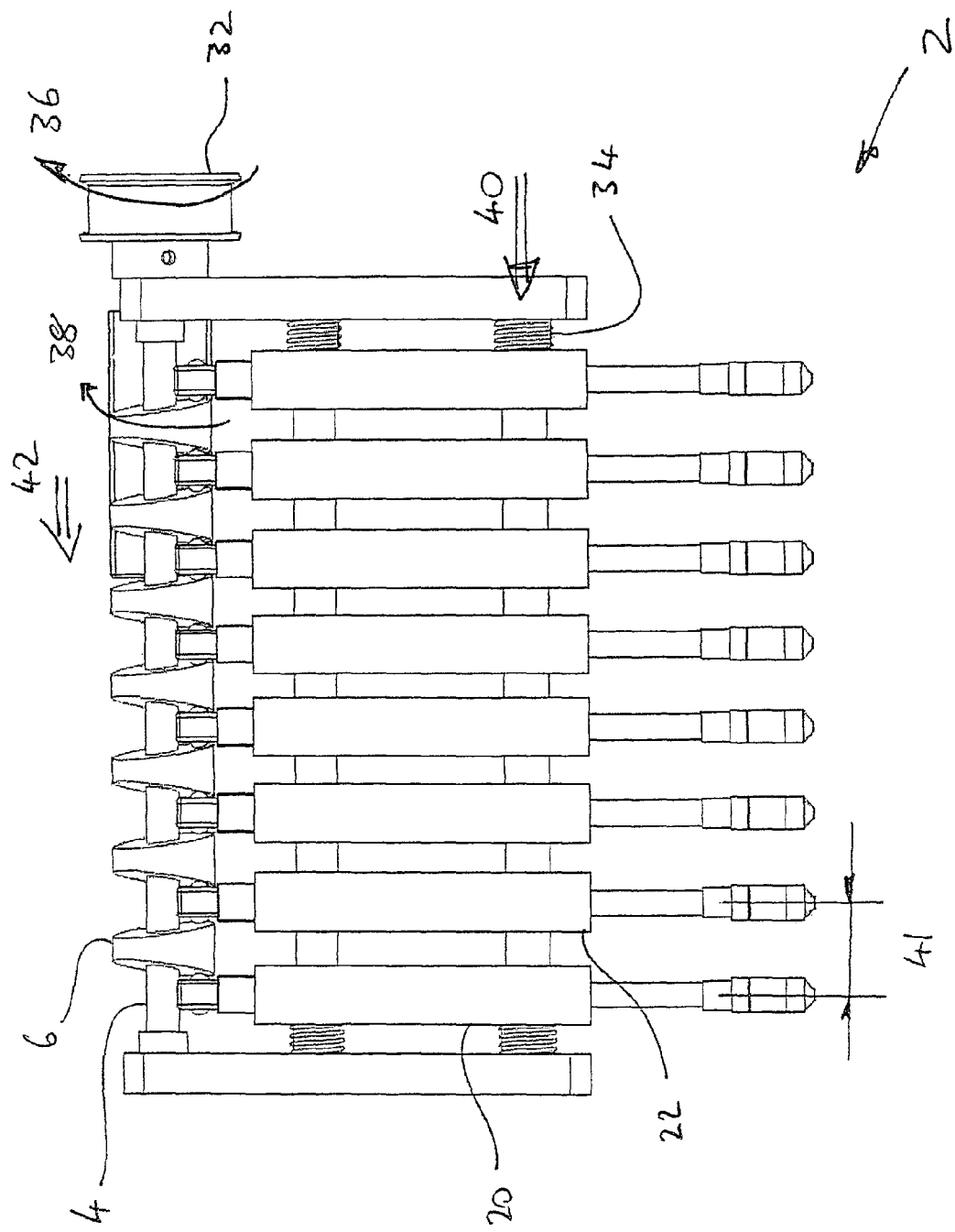

FIGS. 1A and 1B show a picker assembly 2 and in particular the shaft 4 having a plurality of cam plates 6 attached thereto. In particular, FIG. 1A shows the picker assembly 2 having a minimum spacing 11, with FIG. 1B having a maximum spacing 41.

In this embodiment, there are seven cam plates to accommodate eight pickers 20. The cam plates 6 are placed in the interstitial spaces between adjacent pickers 20, 22 and in this embodiment engaged with followers 16, 18 for both adjacent pickers 20, 22. As the shaft 4 rotates, the cam plates 6 also rotate about their common axis 14. The cam plates are of a variable thickness from a minimum 12 to a maximum 10 and so on rotation 30 of the shaft 4, by pulley 32, the cam plates are rotated 28 which shift 26 the pickers a pre-determined distance along an axis parallel to the axis of rotation 14 of the cam plates and shaft, and so vary the spacing 11 of said pickers 20, 22.

In this embodiment the cam plates 6 are spaced symmetrically about a central cam plate 8 with each of the cam plates consistently aligned such that the thicknesses of each of the cam plates is the same at any point around the periphery. Thus as the shaft rotates and consequently the cam plates rotate, the cam plates 6 at the end have the benefit of a cumulative effect of all of the cam plates symmetrically around the central cam plate 8.

FIG. 1B shows the effect of the expansion to a maximum spacing 41 as a result rotation 28 of the cam plates. A reversal of this rotation 38 as a result of the rotation 36 of the shaft 6 will move 42 the cams from a maximum thickness 10 to the minimum thickness 12. The spacing of the pickers 20, 22 is returned to the orientation shown in FIG. 1A through the biasing force applied by springs 34 positioned to apply a "spacing minimizing force" 40 directed inward.

Figure 2A:
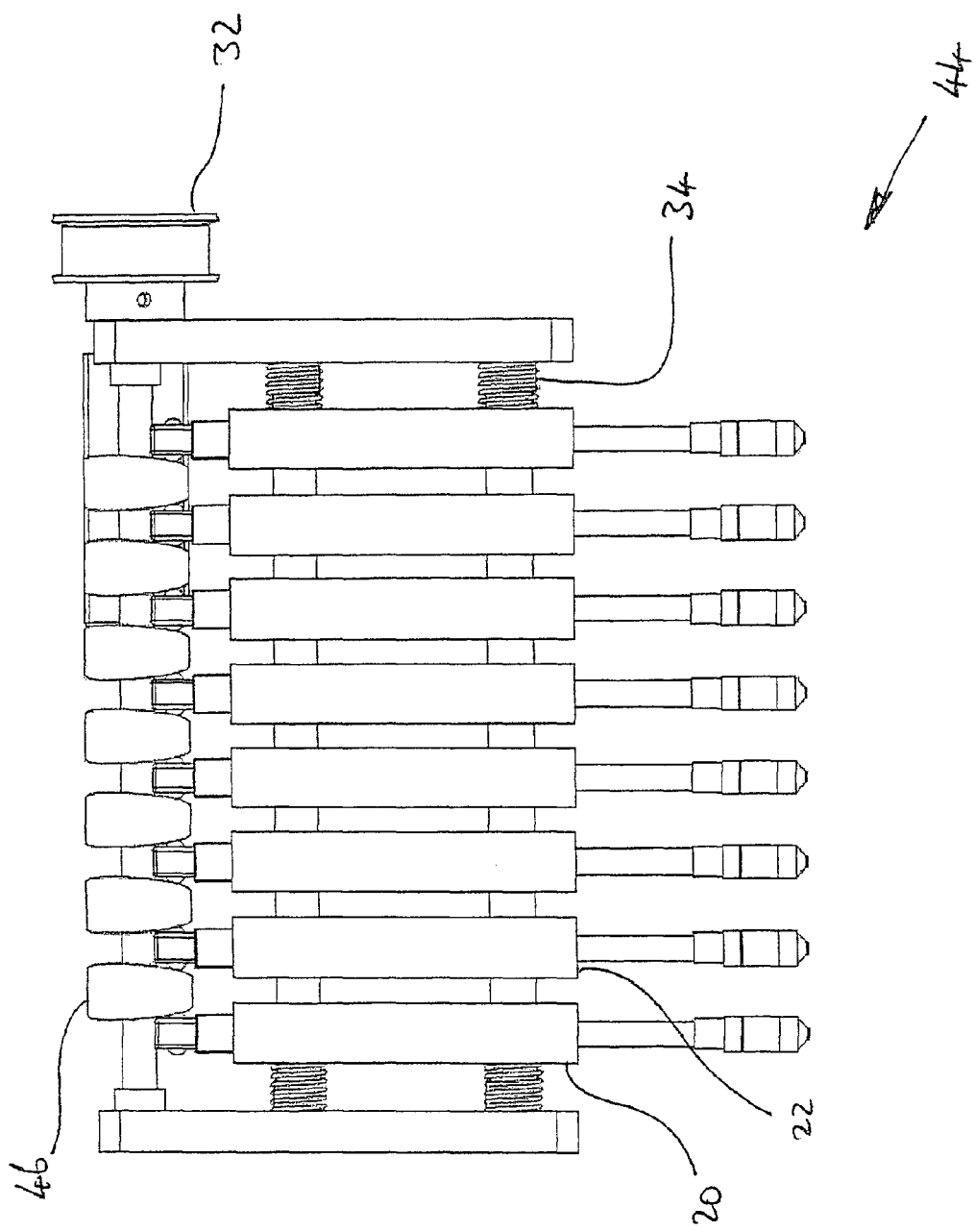
FIGS. 2A and 2B are various views of a picker assembly according to further embodiment of the present invention.
Figure 2B:
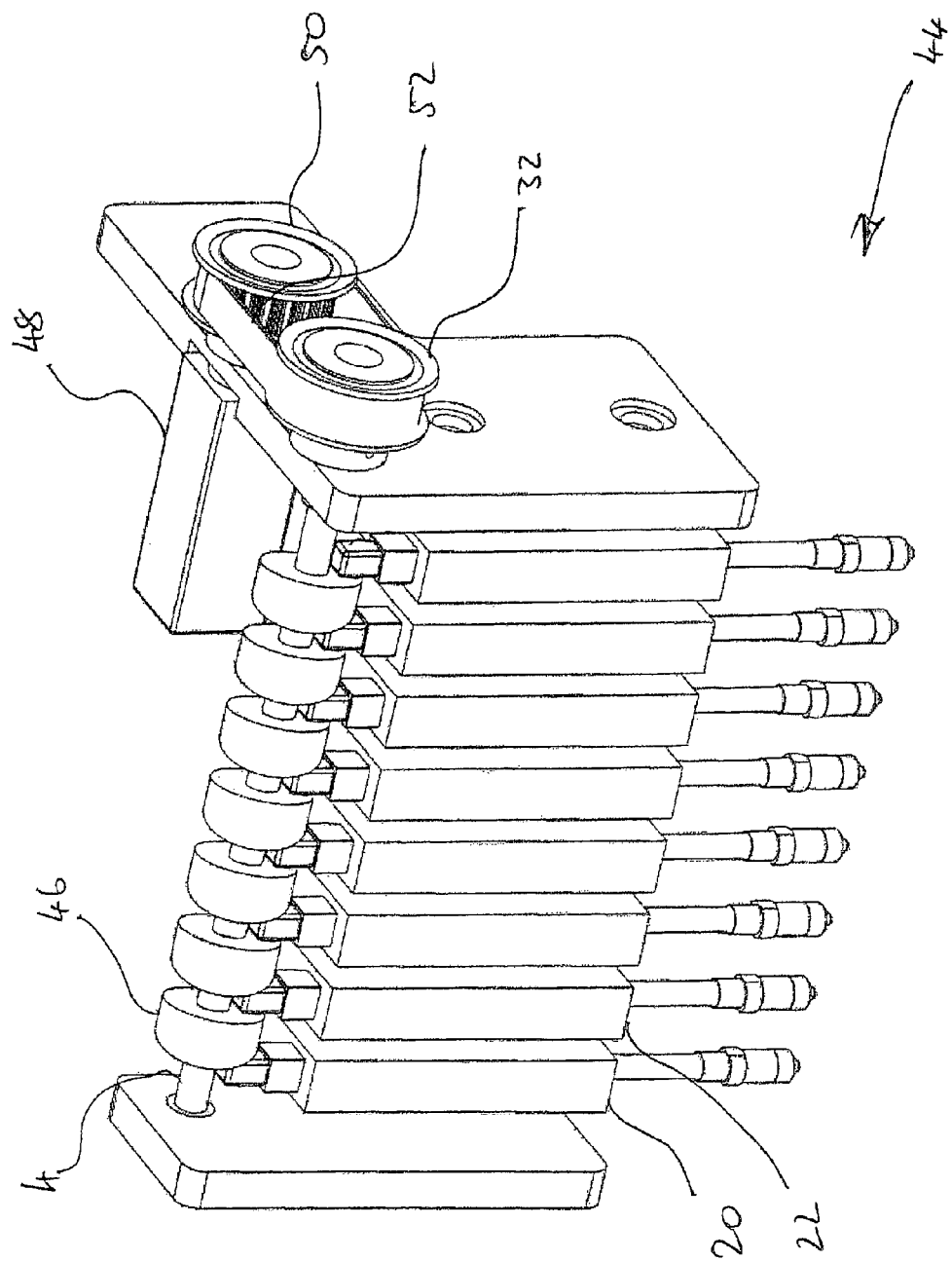

FIGS. 2A and 2B show a further embodiment of a picker assembly 44, whereby the cam plates are of a less angular shape, representing less variation between the maximum and minimum spacing of the pickers 20, 22. FIG. 2B further shows the motor arrangement, which may be equally applicable to the picker assembly 2 of FIGS. 1A and 1B.

In this embodiment the shaft 4 is rotated through a motor 48 such as a stepper motor or a synchronized motor which is fixed to the shaft through a belt drive 50, 52, 32. It will be appreciated that a direct drive motor attached to the shaft may also be useful and that the particular manner in which the shaft is driven is not critical to the invention.

Figure 3A:
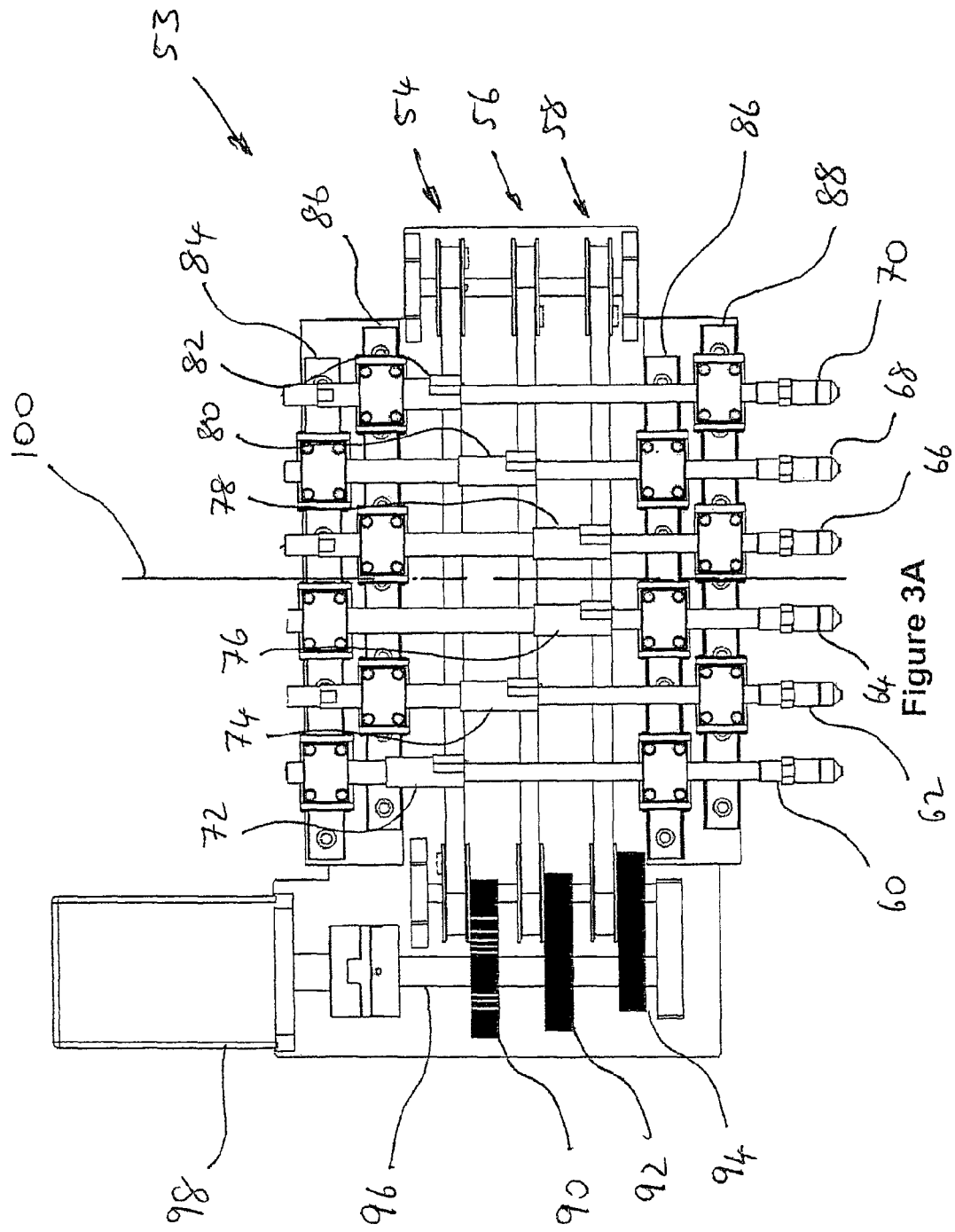
FIGS. 3A and 3B are various views of a picker assembly according to a second aspect of the present invention.
Figure 3B:
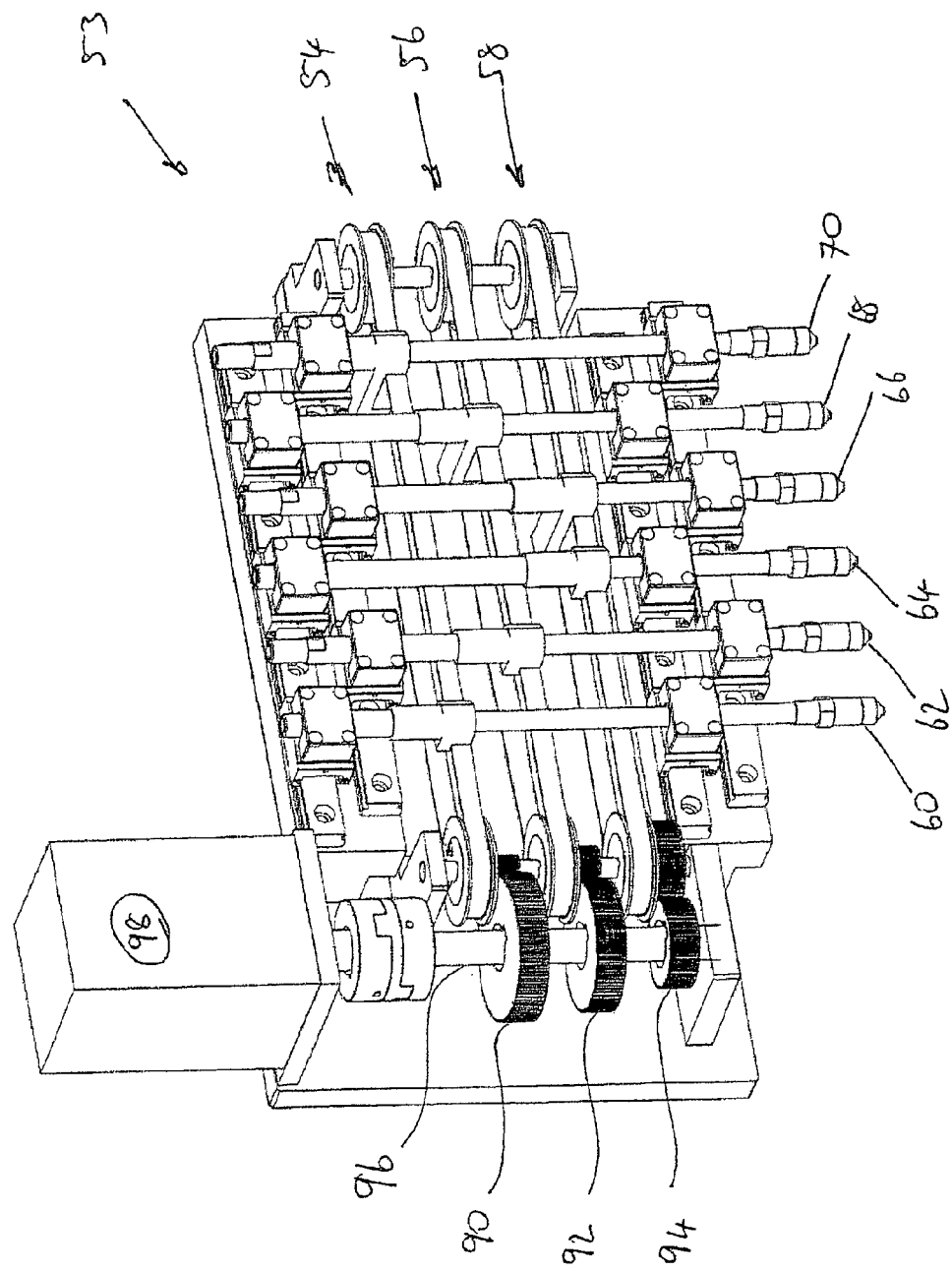

FIGS. 3A and 3B show a picker assembly 53 according to a further aspect of the present invention. Here the pickers 60, 62, 64, 66, 68, 70 are mounted in pairs to timing belts 54, 56, 58. The pickers are further mounted to the timing belts through support members 72, 74, 76, 78, 80, 82, 84. The support shafts are in turn mounted to rails 84, 86, 86, 88.

The timing belts 54, 56, 58 are driven from a shaft 96 with gears 90, 92, 94 associated with each timing belt 54, 56, 58. Each of the gears is mounted to the shaft 96 and so rotation of the shaft 96 causes simultaneous driving of the gears 90, 92, 94 which in turn simultaneously drive the timing belts 54, 56, 58.

Each of the timing belts is associated with a pair of pickers. For instance, the first timing belt 54 is associated with the outermost pair of pickers 60, 70 which are located at extreme ends of the array of pickers. The second belt 56 is associated with the intermediate pickers 62, 68 with the third belt 58 associated with the innermost pickers 64, 66. It will be noted that each member of the pair is symmetrically located about a centerline 100. The gearing of each of the gears 90, 92, 94 are dependent upon the location of the corresponding pair of pickers. For instance the outermost pickers 60, 70 have a gear arrangement 90 with a ratio of 5:1. Similarly the second timing belt 56 has a gear 92 with a ratio of 3:1 with the innermost pair having a gear with a gear ratio of 1:1.

It will be appreciated that on rotating the shaft 96 with simultaneous activation of the gears 90, 92, 94, that the higher gear ratio the higher the speed of the timing belt and consequently the further will be the movement of the associated pickers. Therefore, as each of the timing belts is moving simultaneously, the gearing of the gears 90, 92, 94 ensure that the spacing between adjacent pickers will remain constant.

It will be appreciated that whilst the assembly 53 shown in FIGS. 3A and 3B is for six pickers, the number of pickers used may vary considerably, with additional pairs of pickers involving the consequential gearing to accommodate this. For instance for an eight picker arrangement, with the extra pair placed at extreme ends of the picker array, a fourth timing belt would be required having a gearing ratio of 7:1.

Figures 4A, 4B:
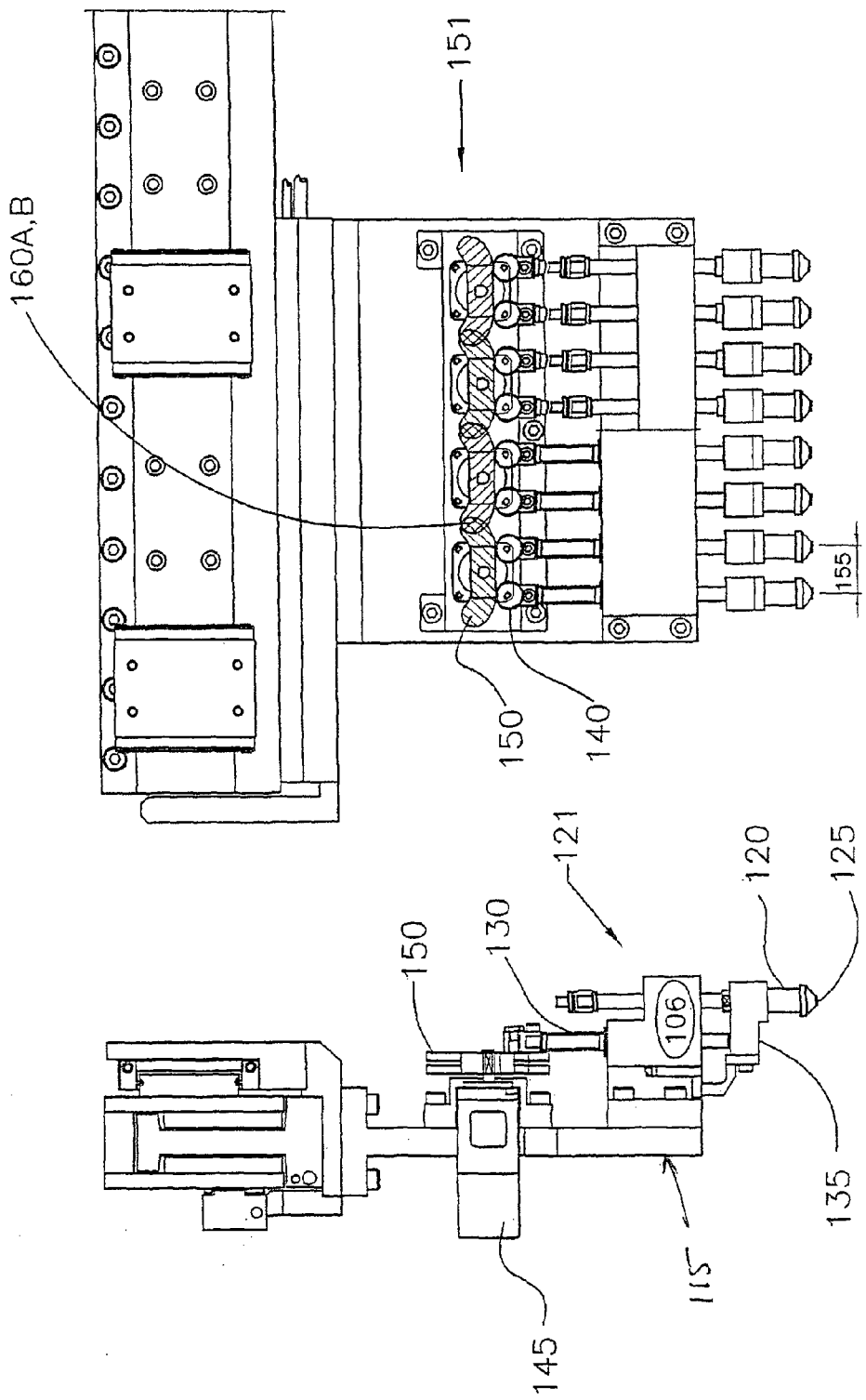
FIGS. 4A and 4B are various views of a picker assembly according to a third aspect of the present invention.

FIGS. 4A and 4B show a picker assembly according to a further aspect of the present invention. The picker assembly 122 has a unit picker array 121 having parallel actuator and engagement shafts 120, 130 coupled by a coupling block 135. The unit pickers 121 are positioned within a block 106 which permits vertical motion which, together, is mounted to a frame 115. The unit picker array 121 includes a contacting portion located at the top of the actuator shaft 130. In this case, located at the top of the actuator shaft 130 is a follower 140 arranged to contact a drive member, such as a rotating arm 150. In this embodiment, the rotating arm is intended to act in a "cam-type" arrangement with the follower remaining in contact with the rotating arm. The rotating arm is shaped to provide graded velocity of descent as the arm rotates. It will be appreciated that if the arm were straight, on a constant rotation of the arm, the picker would have a constant velocity. By shaping the rotating arm with a curvature at extreme ends, the picker decelerates as it approaches and accelerates on retraction from the point of contact with the IC unit. In this way, undue acceleration on the unit may be avoided, as well as minimizing fatigue effects on the picker and mechanism due to the shock of "instant" deceleration and acceleration from the constant velocity to termination of the rotation of the arm.

In keeping with the principle of the present invention of reducing the ratio of motors to unit pickers in the embodiment of FIGS. 4A to 4C, the ratio is four motors to eight pickers. In the second embodiment, the driving mechanism and actuator assembly is removed and replaced by an actuator array 151. In this case for eight pickers, there are four motors within the array 151 having one motor for every two pickers. Each motor is associated with a rotating arm 150 with each end of the rotating arm 150 corresponding to a unit picker 121.

Figure 5C:
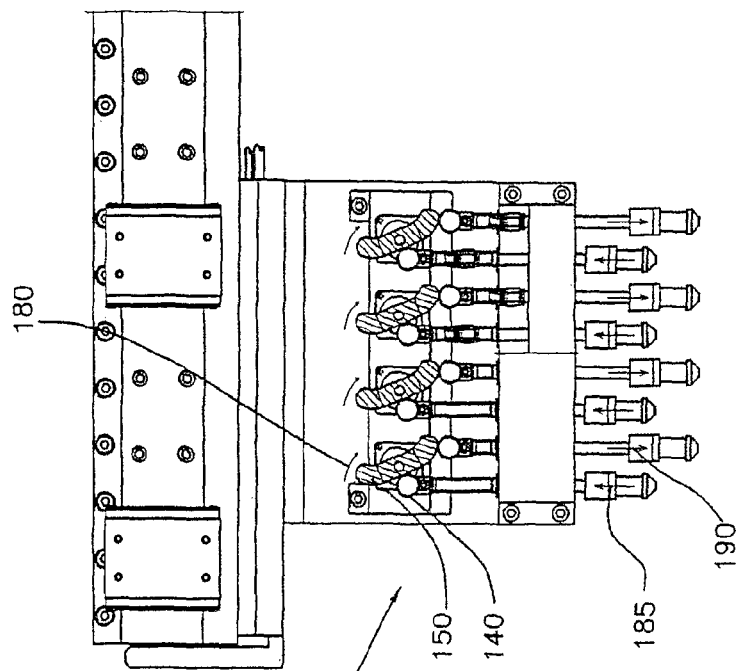
FIGS. 5A, 5B and 5C are sequential elevation views of the picker assembly of FIG. 4A performing a simultaneous engagement.
Figure 5B:
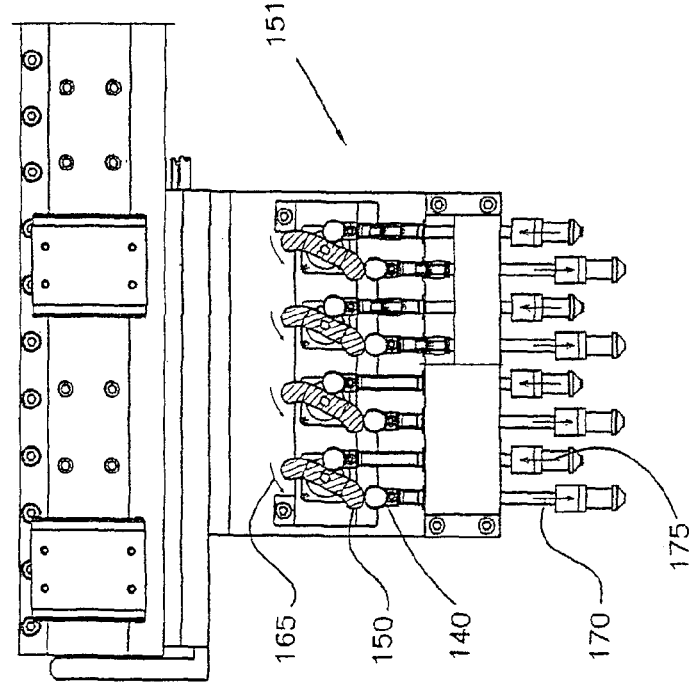
Figure 5A:
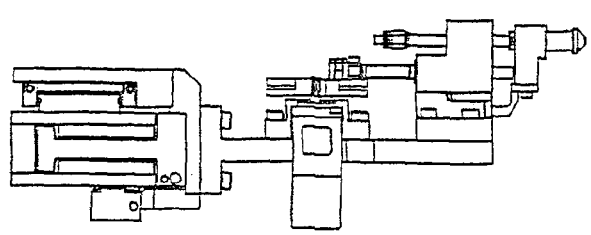

The unit picker assembly 122 according to this embodiment is arranged to pick up four singulated units at a time and thus each motor involves directing a unit picker to engage a unit simultaneously. FIGS. 5A, 5B and 5C show the method of operation of this embodiment. In FIG. 5B each motor activates to rotate 165 the rotating arm 150 in a counterclockwise fashion. The rotating arms being in contact with the followers 140 for each picker follow the rotating arm which is biased upwards by a spring 130. Thus by rotating 165 in a counterclockwise fashion, the left hand unit pickers are pushed downward 170 with the right hand pickers permitted to move upwards 175 under action of the spring 130. In the downward action the pickers are brought in to correspondence with singulated units and therefore are able to engage the units simultaneously. It will be appreciated that for this embodiment, the singulated units will have a spacing similar to that of the clearance between the individual unit pickers to permit this simultaneous engagement.

FIG. 5C show the next phase whereby the rotating arm 150 is rotated 180 in a clockwise direction so as to force the right hand pickers downwards and allow the left hand pickers to be urged upwards by the spring. Thus the next four units can be engaged ready for transfer.

The exact nature of the arrangement of the units may vary, for instance, in some instances the units may be placed in a checker board arrangement and so in order for the second four units to be engaged, the unit assembly 122 may need to be shifted so as to bring the second four pickers into correspondence with the second four units. The arrangement of the units to be engaged does not form part of the invention and so the unit picker assembly 122 may be adaptable to a wide range of unit distribution.

In this embodiment where clearance 155 between the unit pickers is of importance, adjacent rotating arms may be profiled to permit an overlap 160A, B between adjacent arms so that the rotation of said arms does not interfere with each other. Thus as shown in FIGS. 4A and 4B, adjacent arms can be placed relatively close to each other without the arms actually contacting each other.

The unit picker assembly shown in FIGS. 5A, B and C show one embodiment whereby four integrated circuit units are simultaneously engaged. In this operation the rotating arms of all the adjacent motors operate at the same time to raise and lower the unit pickers as a group. FIGS. 6A, 6B, 6C and 6D show the same device operating according to a further embodiment of a present invention. Here the motors operate individually so as to operate the individual pairs of unit pickers separately. In this mode, individual integrated circuit units are engaged rather than a group simultaneously.

FIG. 6B shows the first step whereby the first motor rotates 161 to lower 162 the first unit picker 172 to engage a single integrated circuit unit. Correspondingly the second unit picker 173 rises 163 due to a biasing effect from a spring positioned within the assembly.

FIG. 6C shows the second step whereby the rotating arm 150 rotates clockwise 164 to correspondingly raise 166 the first unit picker 172 so as to lower 167 the second unit picker 173 in order to engage an integrated circuit unit.

Having engaged an IC unit with both the first and second pickers 172, 173, the first motor returns to an equilibrium position whereby the unit pickers are level and the second motor begins operation. FIG. 6D shows a rotation 168 in order to lower the third unit picker 174 in a similar fashion to that shown in FIG. 6B for the first unit picker. Accordingly the array 151 of unit pickers is individually engaged in order to pick up individual integrated circuit units. Accordingly the embodiments of FIGS. 6A to 6D show individual operation of the unit pickers as compared to the simultaneous arrangement shown in FIGS. 5A to 5C. It will be appreciated that any combination from individual operation to simultaneous operation may be possible with the arrangement according to this embodiment.

The invention claimed is:

1. A picker assembly comprising
a plurality of pickers in selective variable spaced relation;
a shaft having a plurality of cam plates, said cam plates co-axial with said shaft and having a variable thickness;
said cam plates in engagement with said pickers and positioned in interstitial spaces between said pickers;
wherein the selective variability in spacing is provided by rotation of the shaft such that thickness variation of the cam plates move the respective pickers along an axis parallel to the shaft; and
wherein said cam plates are placed so as to be engaged with adjacent pickers, said cam plates arranged on the shaft such that the thickness of each of said cam plates is the same at each point around the circumference of each plate.

2. The assembly of claim 1 wherein the thickness variation of the cam plates is continuous about the circumference of the cam plate.

3. The assembly according to claim 1 wherein the thickness variation is stepped, said stepped thickness a function of predetermined spacing of said pickers.

4. The assembly according to claim 1 wherein the cam plates are placed so as to be engaged with adjacent pickers, said cam plates arranged on the shaft such that the thickness of each of the cam plates is the same at each point around the circumference of each plate.

5. The assembly according to claim 1, wherein the pickers are arranged to operate in a reciprocal motion to engage IC units through operation of any one of: servo-motors, ball screw motors or pneumatic or hydraulic pistons.

6. A method for picker assembly for selectively varying the spacing of pickers within a picker assembly, the method comprising the steps of:
rotating a shaft having a plurality of co-axial cam plates, said earn having a variable thickness, said cam plates in engagement with said pickers;
biasing said pickers using said earn plates, and consequently;
wherein the selective variability in spacing is provided by rotation of the shaft moving the respective pickers along an axis parallel to the shaft so as to vary the respective picker spacing; and
wherein said cam plates are placed so as to be engaged with adjacent pickers, said cam plates arranged on the shaft such that the thickness of each of said cam plates is the same at each point around the circumference of each plate.

7. A method for picker assembly for selectively varying the spacing of pickers within a picker assembly, the method comprising the steps of:
providing a plurality of pairs of pickers, with each picker positioned symmetrically about a centerline, said pairs placed sequentially from an innermost pair closest to the centerline to an outermost pair, furthest from the centerline;

simultaneously moving a plurality of belts, each belt having a pair of said pickers mounted thereto;

diverging or converging corresponding pickers within each pair as a result of moving said belts, and consequently;

selectively varying the spacing of said pickers.

8. A picker assembly comprising:

a plurality of pairs of pickers, with each picker positioned symmetrically about a centerline, said pairs placed sequentially from an innermost pair closest to the centerline to an outermost pair, furthest from the centerline;

a plurality of belts, each belt having a pair of said pickers mounted thereto;

each of said belts arranged in a loop about a pair of pulleys, with one picker on an upper part of the loop and corresponding other picker on a bottom portion, such that movement of the belt diverges or converges corresponding pickers within each pair;

each belt in communication with a fixed ratio gearbox, with said gearboxes mounted on a common shaft;

wherein the gear ration of each gearbox is a function of the position of the corresponding pair of pickers, said ration corresponding to the number of interstitial spaces between corresponding pickers within each pair.

9. The picker assembly according to claim 8, further including support members coupled with each picker, said support member in sliding engagement with rails, said support members arranged such that movement of the pickers consequently moves the support members along said respective rails.

10. The picker assembly according to claim 8, wherein there are 3 pairs of pickers, with the respective gear ratios being 1:1, 3:1 and 5:1 for the pair from the innermost to outmost pairs.

11. The picker assembly according to claim 8, wherein the shaft is coupled to a motor for rotating the shaft and operating the gearboxes.

12. The picker assembly according to claim 9, wherein there are 3 pairs of pickers, with the respective gear ratios being 1:1, 3:1 and 5:1 for the pair from the innermost to outmost pairs.

13. A picker assembly for engaging singulated IC units, the assembly comprising a plurality of unit picker pairs, each unit picker within said pair having an engagement end for engagement of an IC unit;

each of said unit pickers movably mounted to permit movement from a retracted position to a unit engagement position;

a plurality of curvilinear drive members having arcuate portions at opposed ends, each drive member corresponding to each of said unit picker pairs each of said unit picker within said corresponding pair arranged to contact the drive member at the arcuate portion of said drive member;

wherein each of said drive members being rotatable about a horizontal axis intermediate said opposed ends such that rotation of the drive member in a first direction forces one of said unit pickers downward and a rotation in a second direction drives the other unit picker downwards.

14. The unit picker assembly according to claim 13 wherein said unit pickers are resiliently biased upwards such that said unit pickers maintain resilient contact with the drive member.

15. The unit picker assembly according to claim 13 wherein said drive members are positioned equi-distant between said opposed ends of said drive member.

16. The unit picker assembly according to claim 15 wherein the distance from the horizontal axis to the opposed ends is greater than half the distance between adjacent horizontal axes of adjacent drive members.

17. The unit picker assembly according to claim 16 wherein at least a portion of each drive member is profiled so as to permit overlap of adjacent drive members without causing contact.

18. The unit picker assembly according to claim 13 wherein on rotation of said drive members, one of each pair of unit pickers is moved to an engagement position so as to engage a plurality of IC units simultaneously.

19. The unit picker assembly according to claim 13 wherein said drive members are positioned equi-distant between said opposed ends of said drive member.

* * * * *